United States Patent [19]

Fujioka

[11] Patent Number: 4,908,734
[45] Date of Patent: Mar. 13, 1990

[54] HOUSING FOR MOTOR CONTROL UNIT

[75] Inventor: Yoshiki Fujioka, Higashiyamato, Japan

[73] Assignee: Fanuc Ltd., Yamanashi, Japan

[21] Appl. No.: 211,233

[22] PCT Filed: Nov. 4, 1987

[86] PCT No.: PCT/JP87/00848
§ 371 Date: Jun. 8, 1988
§ 102(e) Date: Jun. 8, 1988

[87] PCT Pub. No.: WO88/03745
PCT Pub. Date: May 19, 1988

[30] Foreign Application Priority Data

Nov. 12, 1986 [JP] Japan ................ 61-269151

[51] Int. Cl.$^4$ .............................................. H05K 7/20
[52] U.S. Cl. ...................................... 361/383; 361/419; 363/141
[58] Field of Search ............... 174/16, 3; 363/141; 357/81; 165/80, 3, 104.33, 185; 361/331, 380, 393, 395, 394, 382, 429, 383, 386–389, 417, 419, 420

[56] References Cited

U.S. PATENT DOCUMENTS

| 3,940,665 | 2/1976 | Seki | 361/383 |
| 4,015,173 | 3/1977 | Nitsche | 363/141 |
| 4,177,499 | 12/1979 | Volkmann | 361/383 |
| 4,399,486 | 8/1983 | Petsch | 361/383 |
| 4,587,593 | 5/1986 | Liautaud | 361/383 |
| 4,712,160 | 12/1987 | Sato | 363/141 |

FOREIGN PATENT DOCUMENTS 58-16188 4/1983 Japan.
106998 7/1983 Japan.
61-4172 1/1986 Japan.

Primary Examiner—Gerald P. Tolin
Attorney, Agent, or Firm—Staas & Halsey

[57] ABSTRACT

A control unit according to the invention has a plastic case (v) housing only power components (v), such as transistors for an inverter, among components constituting a control circuit. Other circuit components such as resistors are mounted on a printed circuit board, and the case and circuit board are secured to each other by fasteners allowing the case to be made light in weight. Screws for mounting the power components to the case are of the same size, and so are the energizing terminals. This makes possible automated assembly by robot.

14 Claims, 4 Drawing Sheets

HOUSING FOR MOTOR CONTROL UNIT

BACKGROUND OF THE INVENTION

1. Field of the Invention

This invention relates to a control unit in which a plastic case houses power components such as the transistors of an inverter and a smoothing capacitor that are used in an AC motor control apparatus or the like.

2. Description of the Related Art

A control apparatus for an AC motor which drives the spindle of a machine tool uses the circuitry shown in FIG. 4. In order to house this control apparatus in a case 10, it is necessary to have terminals for the illustrated three-phase power supply 14, 15, 16, terminals 18, 19, 20 for feeding current to an AC motor, a ground terminal 26, and terminals 28, 30, $T_2$-2 for a thermostat 32. Principal components such as an electromagnetic contactor 34 rectifying diode 36 smoothing capacitor 38 regenerative transistor 40 transistor inverter 42 and filter 44 are disposed inside the case 10, and a number of control elements such as resistors, capacitors, fuses and diodes are disposed in the case 10 and connected to control lines 46.

Control components of this kind are fixed to a mounting board by tightening screws, and conductive portions are connected by soldering, after which the components are accommodated within the case 10, which is made of metal. In this case, it is necessary to mount a number of components which differ in size, and assembly is carried out manually by a skilled worker. A problem that results is poor operating efficiency. Furthermore, since the case is made of metal, the case is heavy and high in cost. Since the sizes of the circuit components differ depending upon the current capacity of the motor, cases of different size must be fabricated. The result is poor productivity.

SUMMARY OF THE INVENTION

The present invention has been devised in order to solve the foregoing problems and its object is to provide a control unit in which cost can be reduced by improving upon the case for the control apparatus.

In accordance with the present invention, there is provided a control unit including a plastic case having a bottom portion provided at predetermined locations with ribs and a plurality of mounting holes of the same size and an upper portion provided with a predetermined number of engaging members, a plurality of power components such as transistors housed in said case and fixed at the mounting holes by screws and each being provided at an upper portion with energizing terminals of the same size, a printed circuit board having a back side on which there is formed a circuit pattern which contacts the energizing terminals of the power components and a front side on which circuit components such as resistors are disposed, the printed circuit board being fixed to the case by inserting the engaging members of the case in engaging holes formed in the board, and heat radiating fins selected to have a predetermined heat capacity and fixed to the case so as to be freely attachable and detachable.

Thus, in the control unit of the present invention, the bottom of the plastic case is provided with mounting holes at positions which are changed depending upon the sizes of the power components, the power components are fixed to the case by screws of the same size, the energizing terminals of each of the power components have a common size, and the case and printed circuit board are fixed by the engaging holes of the printed circuit board and the engaging members of the case. As a result, there is obtained a control unit which is light in weight and capable of being assembled automatically by a robot. In addition, by suitably selecting the power components and the heat radiating fins and then attaching them to the case, control units having a variety of current capacities can be realized using the same case.

DETAILED DESCRIPTION OF THE PREFERRED EMBODIMENTS

An embodiment of the present invention will now be described in detail with reference to the drawings.

Figure 1:
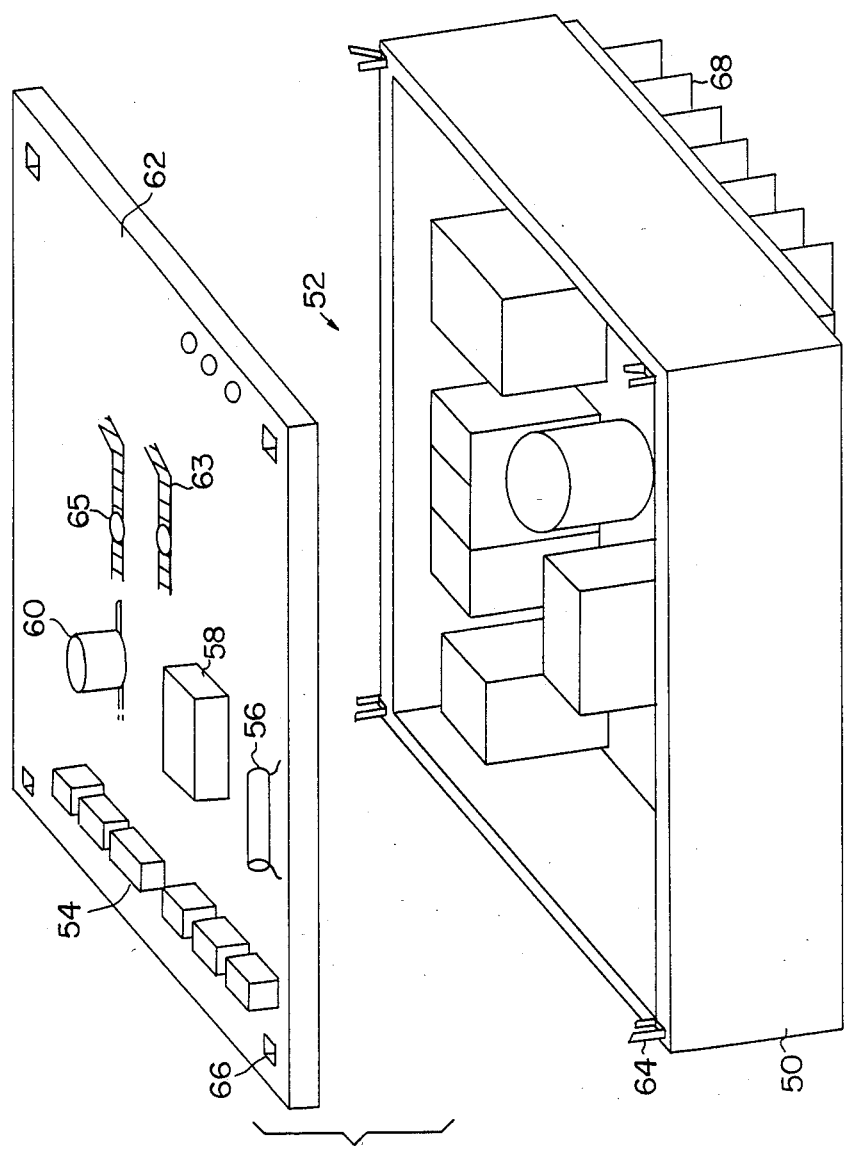
FIG. 1 is a perspective view illustrating the general construction of a control unit having a case according to the present invention.
Figure 4:
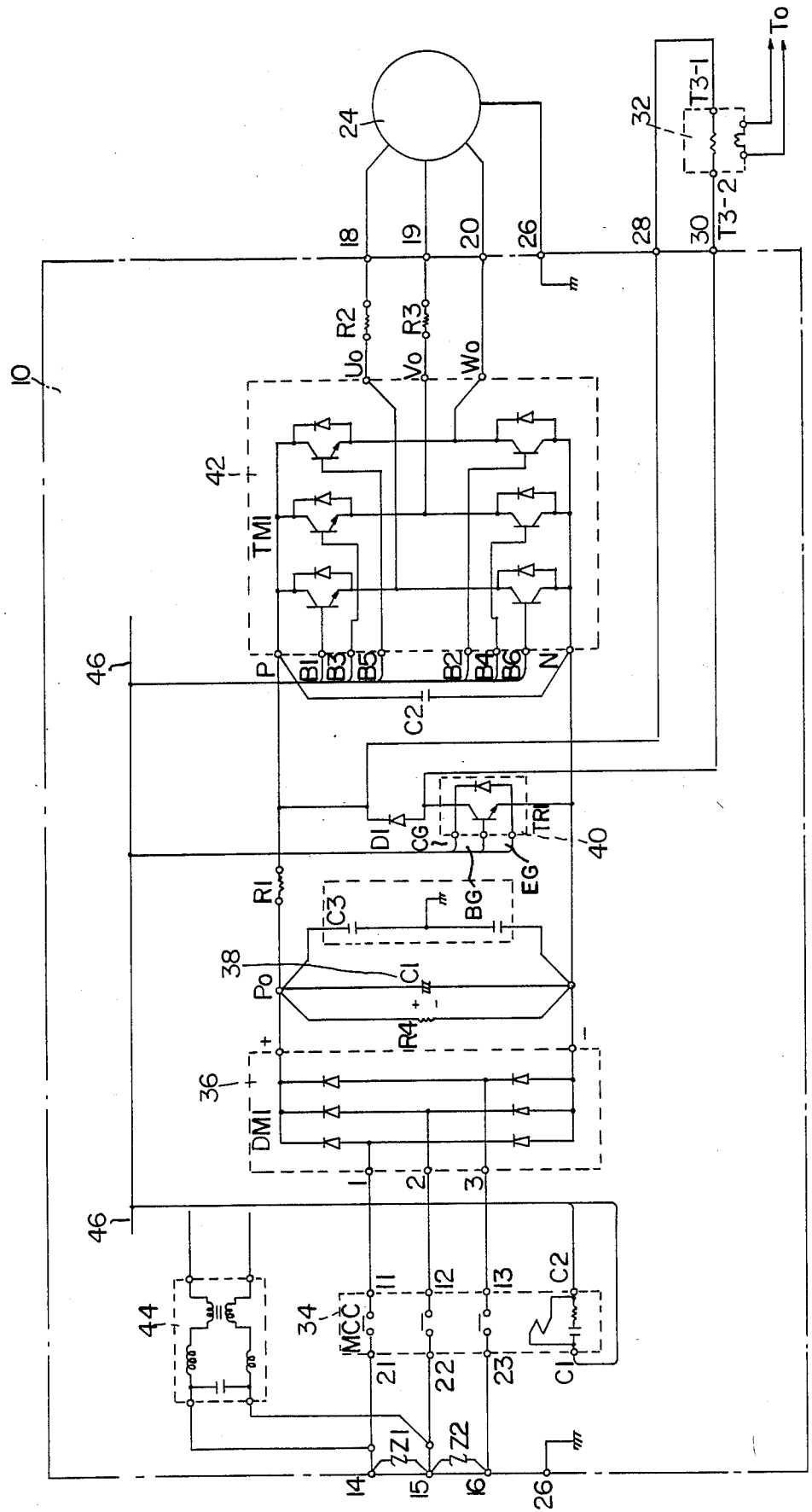
FIG. 4 is a circuit diagram illustrating a control circuit of an AC motor.

FIG. 1 is a view showing the general construction of the present invention. In the present invention, a case 50 is formed of plastic and accommodates power components 52, such as the electromagnetic contactor 34 rectifying diode 36 smoothing capacitor 38 regenerative transistor 40 transistor inverter 42 and filter 4 which are shown in FIG. 4. These components are attached to ribs formed on the bottom of the case 50y. Besides the power components 52 control components such as a resistor 54 fuse 56 relay coil 58 and capacitor 60 are formed on a printed circuit board 62 at predetermined positions. Both the top and bottom surfaces of the printed circuit board 62 are provided with wiring patterns comprising copper foil 63, and connections are made via through-holes 65 subjected to electroplating or the like.

Fasteners 64 projecting from the case 50 are inserted into engaging holes 66 of the printed circuit board 62, thereby fixing the same 50 and the printed circuit board 62 to each other. Energizing terminals attached to the power components 52 and the copper foil formed on the bottom side of the printed circuit board 62 are brought into contact to obtain an energizing circuit. Heat radiating fins 68 are attached to the lower portion of the case 50 by mounting screws so as to be freely attachable and detachable.

Thus, the case 50, printed circuit board 62 and heat radiating fins 68 comprise the control unit of the present invention.

Figure 2:
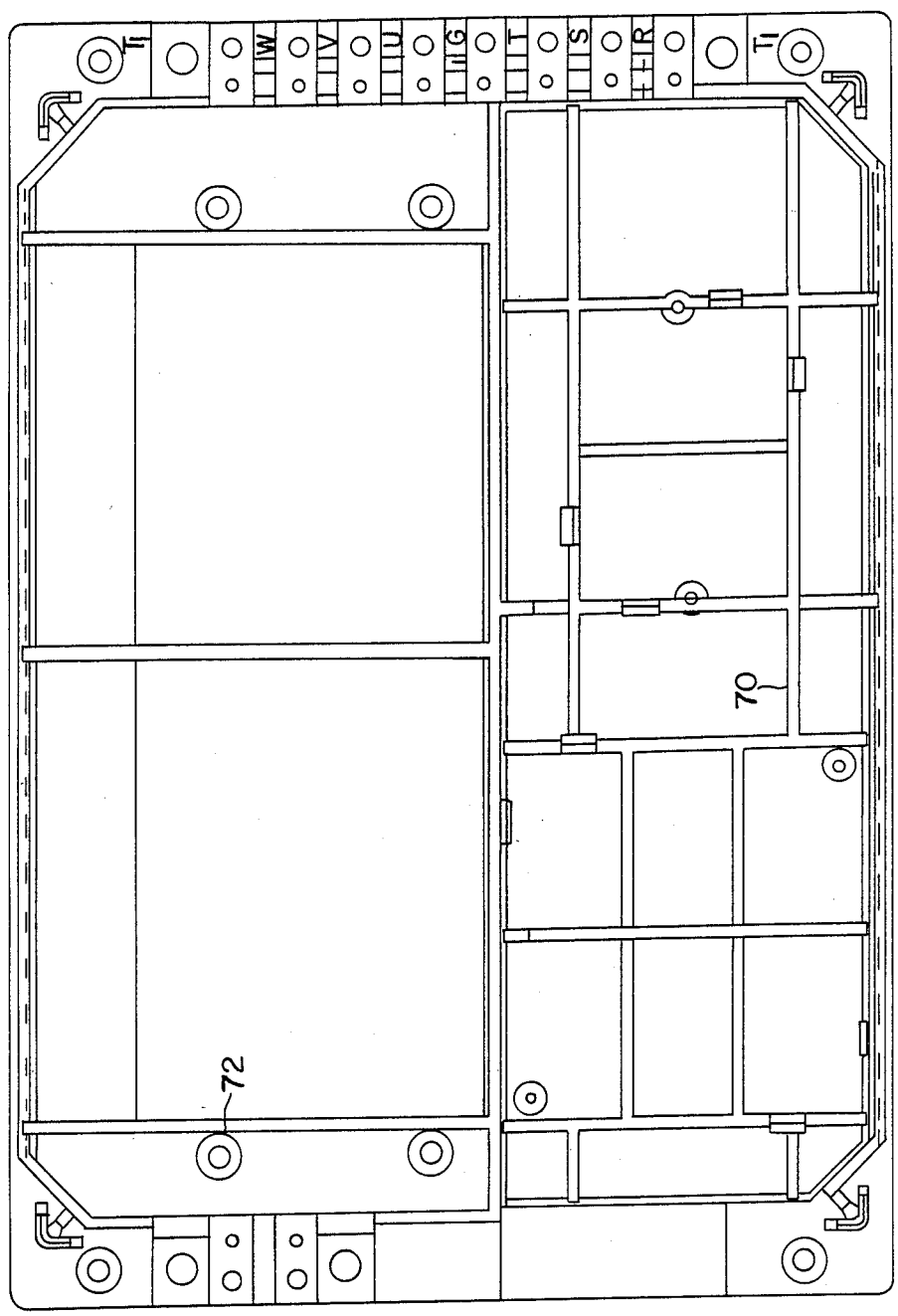
FIG. 2 is a view of the bottom of the case illustrated in FIG. 1.

FIG. 2 is a view of the bottom of the case 50. The bottom is provided with prescribed ribs 70 by, for example, molding. The positions of mounting holes are changed in accordance with the sizes of the power components 52 to be mounted but the sizes of the mounting screws 74 for mounting the power components 52 are the same. Therefore, the same case 50 can be utilized even if AC motors have current capacities that differ from one another (and, of course, have different sizes). Since the number of components inside the case 50 is small, automated assembly by a robot can be carried out in simple fashion.

Figure 3:
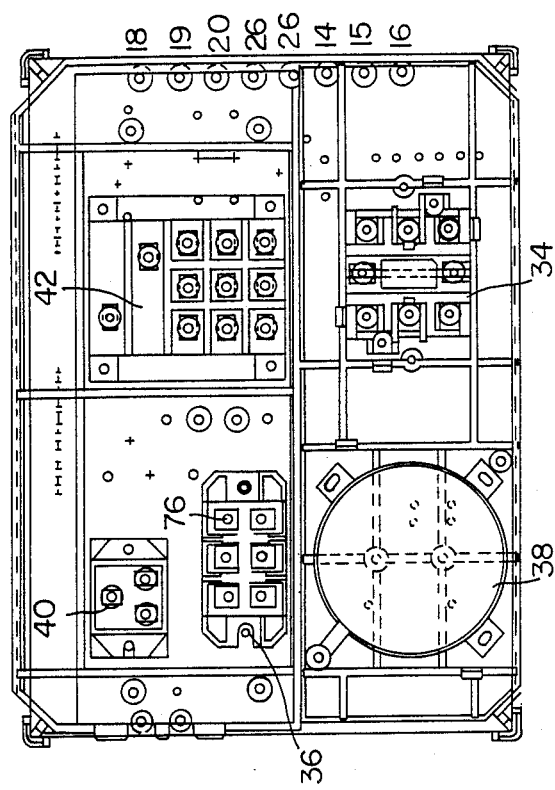
FIG. 3 is a view illustrating power components mounted inside the case.

FIG. 3 is a view showing the power components 52 housed inside the case 50. Energizing terminals 76 of the power components 52 are also of the same size so that mounting by a robot can be performed in a simple manner.

In accordance with the present invention, the case 50 can be made light in weight, the mounting screws 74 for mounting the power components 52 to the case 50 are of the same size, and so are the energizing terminals 76. As a result, the mounting of the power components 52 within the case 50, the attaching of the energizing terminals 76 to the power components 52, and the joining of the case 50 and the printed circuit board 62 can all be carried out automatically by a robot. In addition, the positions of the holes 72 for mounting the components to the case are changed in accordance with the current capacity of the AC motor, and heat radiating fins 68 suitably selected for heat capacity are attached, thereby enabling power components 52 of different sizes to be housed within a case 50 of the same size. The case 50 can be mass-produced to make possible a reduction in manufacturing cost.

Though the present invention has been described with regard to an embodiment thereof, different embodiments can readily be made without departing from the spirit of the invention. Therefore, it is to be understood that the invention is not limited to the specific embodiment thereof except as defined in the scope of the claims.

The control unit of the present invention can be used in an AC motor control apparatus or the like in which a plastic case houses power components such as the transistors of an inverter and a smoothing capacitor.

I claim:

1. A housing for a motor control unit, comprising:
a plastic case having upstanding walls and a bottom, the bottom having an upper surface provided at predetermined locations with ribs and a plurality of mounting holes of the same size extending into the bottom from the upper surface of the bottom, and the walls having an upper portion provided with a predetermined number of engaging members at corners of the case;
a plurality of power components housed in said case and fixed at said mounting holes by screws, each screw being the same size and each power component being provided at an upper portion with energizing terminals of the same size;
a printed circuit board having an underside on which there is formed a circuit pattern which contacts the energizing terminals of said power components and an upper side on which circuit components are disposed, said printed circuit board being fixed to the case by inserting the engaging members of said case through engaging holes formed at corresponding corners of said printed circuit board; and
heat radiating fins selected to have a predetermined heat capacity and fixed to an underside of the bottom portion of the case so as to be freely attachable and detachable.

2. A housing according to claim 1, wherein said plurality of power components comprises:
resistors, an electromagnetic contactor, a rectifying diode, a smoothing capacitor, a regenerative transistor and a transistor invertor.

3. A housing according to claim 1, wherein said printed circuit board comprises copper foil wiring patterns provided on the upper side and upper side thereof, said patterns being connected by through-holes formed in the printed circuit board.

4. A housing according to claim 1, wherein the heat capacity of said heat radiating fins is selected depending upon the current capacity of the plurality of power components.

5. A housing according to claim 2, wherein said printed circuit board comprises copper foil wiring patterns provided on the upper side and under side thereof, said patterns being connected by through-holes formed in the printed circuit board.

6. A housing according to claim 2, wherein the heat capacity of said heat radiating fins is selected depending upon the current capacity of the plurality of power components.

7. A housing according to claim 3, wherein the heat capacity of said heat radiating fins is selected depending upon the current capacity of the plurality of power components.

8. A housing according to claim 3, wherein the through-holes for connecting the patterns on the upper side and under side of said printed circuit board are subjected to electroplating.

9. A housing according to claim 7, wherein the through-holes for connecting said patterns on the upper side and under side of said printed circuit board are subjected to electroplating.

10. A housing for a motor control unit, comprising:
a case including upstanding walls and a bottom, said bottom having ribs on an upper surface thereof and a plurality of mounting holes provided at predetermined locations to extend into the bottom from the upper surface thereof, and an upper portion of said walls having a predetermined number of engaging members at corners of the case;
a plurality of power components mounted in said case with screws at the mounting holes, said screws being the same size and each power component having energizing terminals mounted on upper portions thereof;
a printed circuit board including an underside having a circuit pattern formed thereon which contacts the energizing terminals, an upper side on which a predetermined array of circuit components is disposed, and engaging holes at corresponding corners thereof for receiving therethrough the engaging members of said case for mounting said printed circuit board to said case; and
removable heat radiating fins attached to an underside of the bottom of said case, said fins being selected to have a predetermined heat capacity.

11. A housing according to claim 10, wherein said plurality of power components comprises resistors, an electromagnetic contactor, a rectifying diode, a smoothing capacitor, a regenerative transistor, and a transistor invertor.

12. A housing according to claim 10, wherein said printed circuit board comprises copper foil wiring patterns provided on the upper side and underside thereof, said wiring patterns being electrically connected by through holes formed in said printed circuit board.

13. A housing according to claim 10, wherein the heat capacity of said heat radiating fins is selected depending on the current capacity of said plurality of power components.

14. A housing according to claim 12, wherein the through holes formed in said printed circuit board are electroplated.

* * * * *

UNITED STATES PATENT AND TRADEMARK OFFICE
CERTIFICATE OF CORRECTION

PATENT NO. : 4,908,734

DATED : March 13, 1990

INVENTOR(S) : Yoshiki Fujioka

It is certified that error appears in the above-identified patent and that said Letters Patent is hereby corrected as shown below:

Front Page [57] Abstract, line 2, "(v)" (both occurrences) should be deleted.

Column 1, line 17, delete "$T_2$-2"

Column 3, line 68, "upper" (second occurence) should be --under--.

Signed and Sealed this

Second Day of April, 1991

*Attest:*

HARRY F. MANBECK. JR.

*Attesting Officer*     *Commissioner of Patents and Trademarks*